United States Patent [19]
Nakashima

[11] Patent Number: 5,604,429
[45] Date of Patent: Feb. 18, 1997

[54] RECTIFYING TRANSFER GATE CIRCUIT

[75] Inventor: Takashi Nakashima, Seoul, Rep. of Korea

[73] Assignee: Samsung Electronics Co., Ltd., Suwon, Rep. of Korea

[21] Appl. No.: 176,489

[22] Filed: Dec. 30, 1993

[30] Foreign Application Priority Data

Dec. 31, 1992 [KR] Rep. of Korea ............... 92-27123

[51] Int. Cl.$^6$ ............................................. H02M 7/06
[52] U.S. Cl. ........................ 323/349; 363/126; 363/127
[58] Field of Search .............................. 327/330, 427; 323/371, 349; 363/127, 126, 53

[56] References Cited

U.S. PATENT DOCUMENTS 4,253,162  2/1981  Hollingsworth ................. 327/427
4,661,723  4/1987  Masuda et al. .................. 326/110

OTHER PUBLICATIONS

Microelectronic & Circuits, Sedra & Smith, 3rd edition, 1991, pp. 916–923.

*Primary Examiner*—Peter S. Wong
*Assistant Examiner*—Shawn Riley
*Attorney, Agent, or Firm*—Cushman Darby & Cushman, IP Group of Pillsbury Madison & Sutro LLP

[57] ABSTRACT

A rectifying transfer gate circuit includes first and second field effect transistors and one diode. The source of the first field effect transistor is coupled to a first input node and the gate thereof is coupled to a second input node. Meanwhile, the source of the second field effect transistor is coupled to the second input node and the gate thereof is coupled to the first input node. The diode is coupled between the common drain of the first and second field effect transistors and an output node, so as to increase the speed of the operation in the application circuit utilizing the above rectifying transfer gate circuit.

3 Claims, 8 Drawing Sheets

RECTIFYING TRANSFER GATE CIRCUIT

BACKGROUND OF THE INVENTION

The present invention relates to a rectifying transfer gate circuit, and more particularly, to a rectifying transfer gate circuit which is employed in a logic circuit operated at high speed, the application circuits thereof and its semiconductor structure.

Generally speaking a logic circuit is constituted by a plurality of switching elements such as transistors and diodes. Here, a current controlled logic circuit deals with the current as a signal, and a voltage controlled logic circuit deals with the voltage as a signal. The use of a current controlled logic circuit is limited in specific fields because it increases power consumption and its circuit design is more difficult than the voltage controlled logic circuit.

On the other hand, voltage controlled logic circuits are used more widely. The main components of a voltage controlled logic circuit employ field effect transistors, especially CMOS transistors, which can attain operation stability and reduce power consumption. However, the logic circuit constituted by CMOS transistors requires an additional circuit for inverting the input signal, thereby increasing the stray capacitance and line length so as to increase the signal delay time and the manufacturing cost.

SUMMARY OF THE INVENTION

Accordingly, the first object of the present invention is to provide a rectifying transfer gate circuit which is simple and can be operated in a stable state.

The second object of the present invention is to provide a logic circuit which is associated with a rectifying transfer gate circuit.

The third object of the present invention is to provide a carry logic circuit which is associated with a rectifying transfer gate circuit.

The fourth object of the present invention is to provide an adder circuit which is constituted by the associations of the rectifying transfer gate circuit.

The fifth object of the present invention is to provide a semiconductor device embodying a rectifying transfer gate circuit.

In one embodiment of the rectifying transfer gate circuit according to the present invention, the first and second field effect transistors are constituted by first and second NMOS transistors. The drains of the first and second NMOS transistors are coupled to the cathode of a diode, and the output node is coupled to the anode of a diode. In another embodiment, the first and second field effect transistors are constituted by first and second PMOS transistors. The drains of the first and second PMOS transistors are coupled to the anode of the diode, and the output node is coupled to the cathode of the diode.

In another embodiment of the rectifying transfer gate circuit, the first and second field effect transistors are constituted by first and second NMOS transistors. The drains of the first and second NMOS transistors are coupled to the anode of a diode, and the output node is coupled to the cathode of the diode. In another embodiment, the first and second field effect transistors are constituted by first and second PMOS transistors. The drains of the first and second PMOS transistors are coupled to the cathode of the diode, and the output node is coupled to the anode of the diode.

In another embodiment of the logic circuit according to the present invention, the first and second field effect transistors included in the rectifying transfer gate are constituted by NMOS transistors each having a drain coupled to the cathode of the diode. In another embodiment, the first and second field effect transistor included in the rectifying transfer gate are constituted by PMOS transistors each having a drain coupled to the anode of the diode.

In another embodiment of the logic circuit, the first and second field effect transistors included in a rectifying transfer gate are constituted by NMOS transistors each having a drain coupled to the anode of a diode. In another embodiment, the first and second field effect transistors included in the rectifying transfer gate are constituted by PMOS transistors each having a drain coupled to the cathode of the diode.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

Figure 1:
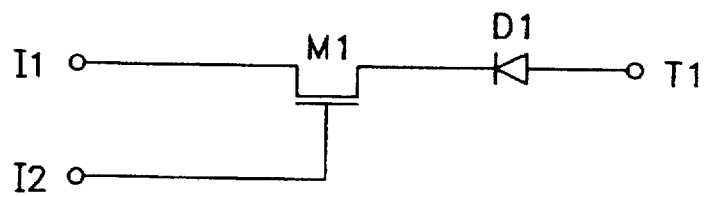
FIG. 1 is a circuit diagram illustrating a first embodiment of the rectifying transfer gate circuit according to the present invention.

FIG. 1 is a circuit diagram illustrating a first embodiment of the rectifying gate circuit according to the present invention, wherein the rectifying transfer gate circuit includes input nodes I1 and I2, an output node T1, an NMOS transistor M1, and a diode D1.

In FIG. 1, input node I1 is coupled to the source of NMOS transistor M1, input node I2 is coupled to the gate of NMOS transistor M1, the drain of the NMOS transistor M1 is coupled to the gate of NMOS transistor M1, the drain of NMOS transistor is M1 coupled to the cathode of diode D1, and the anode of diode D1 is coupled to output node T1. Input nodes I1 and I2 receive a first logic input signal and a second logic input signal, respectively. When the second logic input signal is in the logic "high" state, NMOS transistor M1 turn on so as to transfer the first logic input signal to the drain, and when the second logic input signal is in the logic "low" state, NMOS transistor M1 turns off so that the drain is in a high impedance state. When the potential of the output node T1 is higher than that of the drain of NMOS transistor M1 by the diode threshold voltage (e.g., 0.7 V) or more, diode D1 conducts, but is otherwise "OFF".

Figure 2:
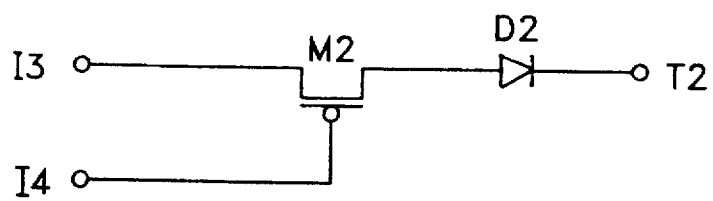
FIG. 2 is a circuit diagram illustrating a second embodiment of the rectifying ransfer gate circuit according to the present invention.

FIG. 2, is a circuit diagram illustrating a second embodiment of the rectifying transfer gate circuit according to the present invention, wherein the rectifying transfer gate circuit includes input nodes I3 and I4, an output node T2, a PMOS transistor M2, and a diode D2.

Referring to FIG. 2, input node I3 is coupled to the source of PMOS transistor M2, and input node I4 is coupled to the gate of PMOS transistor M2. The drain of PMOS transistor M2 is coupled to the anode of diode D2, and the cathode of diode D2 is coupled to output node T2. Input nodes I3 and I4 receive a first logic input signal and a second logic input signal, respectively. When the second logic input signal is in the logic "low" state, PMOS transistor M2 turns on so as to transfer the first logic input signal to the drain, and otherwise turns off so that the drain of PMOS transistor M2 is in a high impedance state. Diode D2 conducts when the potential of the drain of PMOS transistor M2 is higher than the potential of output node T2 by the diode threshold voltage or more, but is otherwise "OFF".

Figure 3:
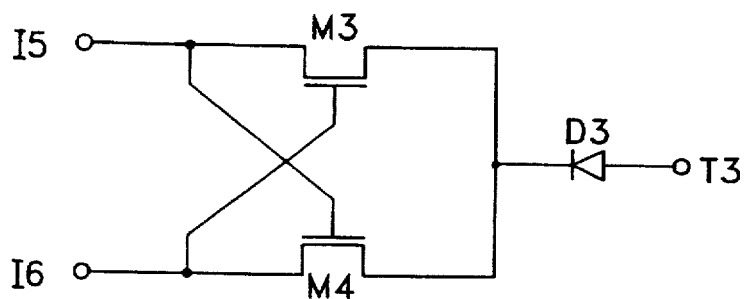
FIG. 3 is a circuit diagram illustrating a third embodiment of the rectifying transfer gate circuit according to the present invention.

FIG. 3 is a circuit diagram illustrating a third embodiment of the rectifying transfer gate circuit according to the present invention, wherein the rectifying transfer gate circuit includes input nodes I5 and I6, an output no de T3, NMOS transistors M3 and M4, and a diode D3.

In FIG. 3, the source of NMOS transistor M3 is coupled to input node I5, the gate of NMOS transistor M3 is coupled to input node I6, and the drain of NMOS transistor M3 is coupled to the cathode of diode D3. Correspondingly, the source of NMOS transistor M4 is coupled to input node I6, the gate of NMOS transistor M4 is coupled to input node I5, and the drains of NMOS transistors M3 and M4 are commonly coupled to the cathode of diode D3. Input nodes I5 and I6 receive a first logic input signal and a second logic input signal, respectively. When the second logic input signal is "high", NMOS transistor M3 turns on so as to transfer the first logic input signal to the drain of NMOS transistor M3. When the first logic input signal is "high", NMOS transistor M4 turns on so as to transfer the second logic input signal to the drain of NMOS transistor M4. Here, the drain of NMOS transistor M3 and the drain of NMOS transistor M4 are tied together, and the logic states thereof will be summarized in the following Table 1, according to the first and second logic input signals.

TABLE 1

| first logic input signal | second logic input signal | drain state |
|---|---|---|
| "high" | "high" | "high" |
| "high" | "low" | "low" |
| "low" | "high" | "low" |
| "low" | "low" | high impedance |

Diode D3 turns "ON" when the potential of the common drain is lower than the potential of output node T3 by the diode's threshold voltage or more, but is otherwise "OFF".

Figure 4:
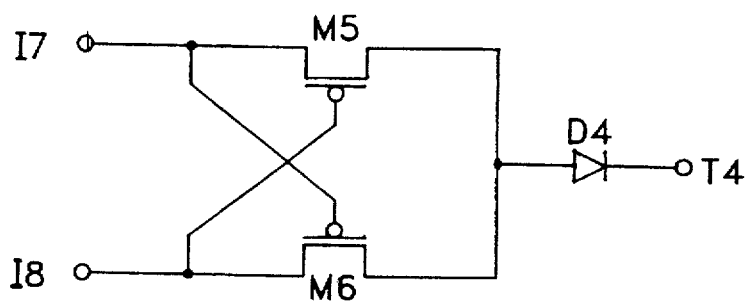
FIG. 4 is a circuit diagram illustrating a fourth embodiment of the rectifying transfer gate circuit according to the present invention.

FIG. 4 is a circuit diagram illustrating a fourth embodiment of the rectifying transfer gate circuit according to the present invention, wherein the rectifying transfer gate circuit includes input nodes I7 and I8, an output node T4, PMOS transistors M5 and M6, and a diode D4.

In FIG. 4, the source of PMOS transistor M5 is coupled to input node I7, the gate of PMOS transistor M5 is coupled to input node I8, and the drain of PMOS transistor M5 is coupled to the anode of diode D5. Correspondingly, the source of PMOS transistor M6 is coupled to input node I8, the gate of PMOS transistor M6 is coupled to input node I7, and the drains of PMOS transistors M5 and M6 are commonly coupled to the anode of diode D4. Input nodes I7 and I8 receive a first logic input signal and a second logic input signal, respectively. When the second logic input signal is "low", PMOS transistor M5 turns on so as to transfer the first logic input signal to the drain of PMOS transistor M5. When the first logic input signal is "low", PMOS transistor M6 turns on so as to transfer the second logic input signal to the drain of PMOS transistor M6. Here, the drains of PMOS transistors M5 and M6 are tied together, and the logic states thereof will be summarized in the following Table 2, according to the first and second logic input signals.

TABLE 2

| first logic input signal | second logic input signal | drain state |
|---|---|---|
| "high" | "high" | high impedance |
| "high" | "low" | "high" |
| "low" | "high" | "high" |
| "low" | "low" | "low" |

Diode D4 turns "ON" when the potential of the common drain is higher than the potential of output node T4 by the diode's threshold voltage or more, but is otherwise "OFF".

Figure 5:
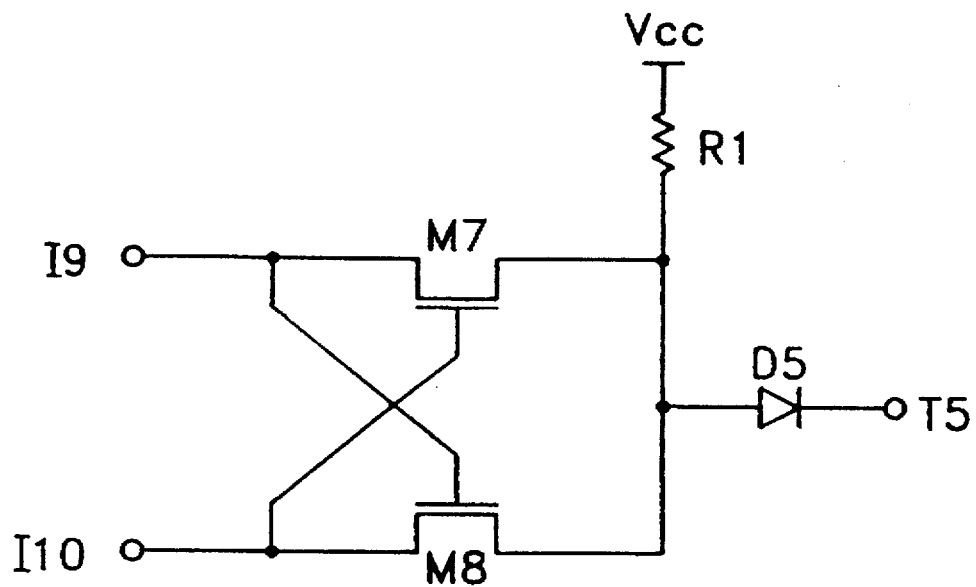
FIG. 5 is a circuit diagram illustrating the rectifying transfer gate circuit according to a fifth embodiment of the present invention.

FIG. 5 is a circuit diagram illustrating a fifth embodiment of the rectifying transfer gate circuit according to the present invention. The rectifying transfer gate circuit includes input nodes I9 and I10, output node T5, NMOS transistors M7 and M8, a reference potential source $V_{cc}$, a conductive load R1, and a diode D5.

In FIG. 5, the source of NMOS transistor M7 is coupled to input node I9, the gate of NMOS transistor M7 is coupled to input node I10, and the drain is coupled to the anode of diode D5. Correspondingly, the source of NMOS transistor M8 is coupled to input node I10, the gate of NMOS transistor M8 is coupled to input node I9, and the drains of NMOS transistors M7 and M8 are commonly coupled to the anode of diode D5. The cathode of diode D5 is coupled to output node T5. The conductive load R1 is coupled between the common drain of NMOS transistors M7 and M8 and the reference potential source $V_{cc}$.

Diode D5 turns "ON" when the potential of the common drain of NMOS transistors M7 and M8 is higher than the potential of output node T5 by the diode's threshold voltage or more, but is otherwise "OFF".

The rectifying transfer gate circuit further includes the conductive load R1 between the common drain of NMOS transistors M7 and M8 and the reference potential source $V_{cc}$ (typically, a logic "high" level), resulting in stabilizing the open state of NMOS transistors M7 and M8 so as to increase the speed of the response. Therefore, the capability of this circuit is varied in accordance with the electrical characteristics of the conductive load. The conductive load may be, for instance, a resistor, a depletion field effect transistor or a constant current source. Here, the constant current source is preferably used.

Figure 6:
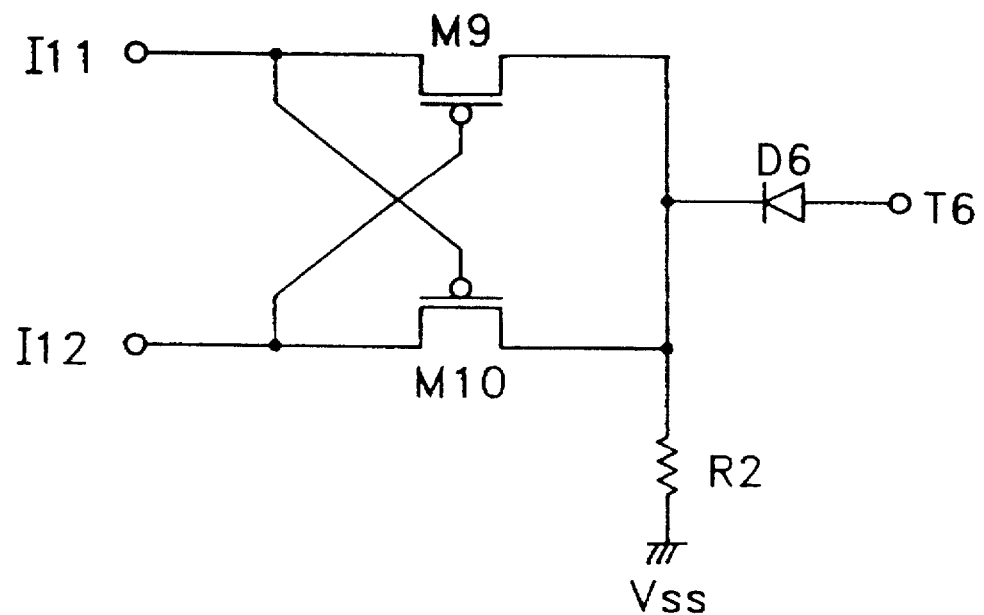
FIG. 6 is a circuit diagram illustrating a sixth embodiment of the rectifying transfer gate circuit according to the present invention.

FIG. 6 is a circuit diagram illustrating a sixth embodiment of the rectifying transfer gate circuit according to the present invention, wherein the rectifying transfer gate circuit includes input nodes I11 and I12, and output node T6, PMOS transistors M9 and M10, a reference potential source $V_{ss}$, a conductive load R2, and diode D6.

In FIG. 6, the source of PMOS transistor M9 is coupled to input node I11, the gate of PMOS transistor M9 is coupled to input node I12, and the drain of PMOS transistor M9 is coupled to the cathode of diode D6. Correspondingly, the source of PMOS transistor M10 is coupled to input node I12, the gate of PMOS transistor M10 is coupled to input node I11, and the drains of PMOS transistors M9 and M10 are commonly coupled to the cathode of diode D6. The conductive load R2 is coupled between the reference potential source $V_{ss}$ (typically ground) and the common drain of PMOS transistors M9 and M10, and output node T6 is coupled to the anode of diode D6.

Diode D6 turns "ON" when the potential of output node T6 is higher than the potential of the common drain of PMOS transistors M9 and M10 by the diode's threshold voltage or more, but is otherwise turns "OFF".

This rectifying transfer gate circuit further includes the conductive load R2 between the common drain of PMOS transistors M9 and M10 and the reference potential source $V_{cc}$, resulting in stabilizing the open state of PMOS transistors M9 and M10 and increasing the speed of the response.

Figure 7:
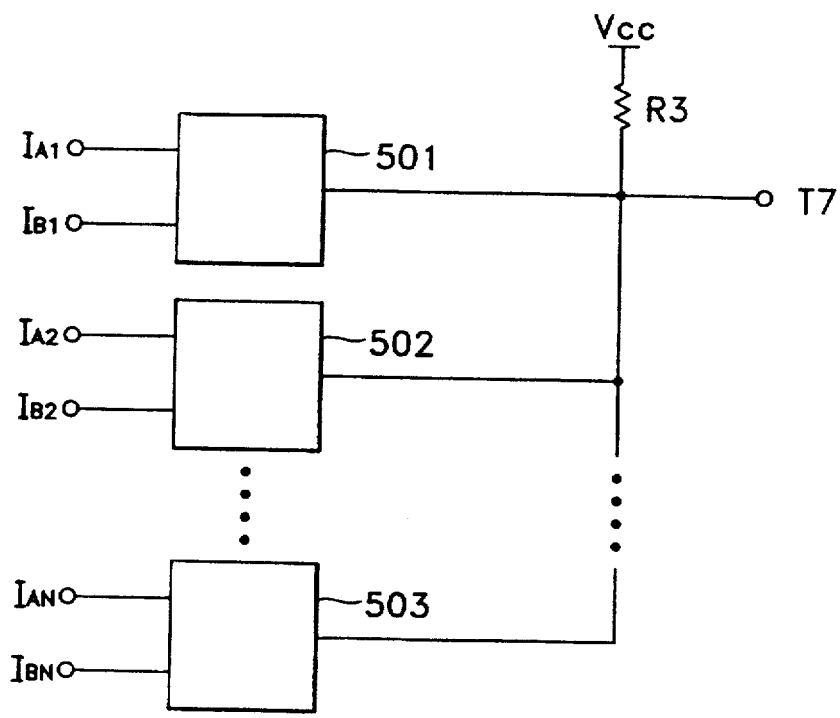
FIG. 7 is a block diagram illustrating the first embodiment the logic circuit according to the present invention.

FIG. 7 is a block diagram illustrating a first embodiment of the logic circuit according to the present invention. It includes a reference potential source $V_{cc}$ for providing a potential typically corresponding to the logic "high" level, an output node T7, a conductive load R3 coupled between the reference potential source $V_{cc}$ and output node T7, and a plurality of two-input rectifying transfer gate circuits 501, 502 and 503.

In FIG. 7, the two-input rectifying transfer gate circuits 501, 502 and 503 each correspond to either the rectifying transfer gate circuit shown in FIG. 3, or that shown in FIG. 6.

Here, if the circuits 501, 502 and 503 correspond to FIG. 3, the output T7 is: (1) with any one pair of inputs to the two-input rectifying transfer gate circuits being different from each other. In other words, if one bit is "high" and the other bit is "low", then, the output node is a logic "low", and otherwise (2), the output node is a logic "high".

Meanwhile, if the circuits 501, 502 and 503 correspond to FIG. 6, the output T7 is: (1) with any pair of inputs of the two-input rectifying transfer gate circuits being both logic "low," then, the output node is a logic "low", and otherwise, (2) the output node is a logic "high."

Figure 8:
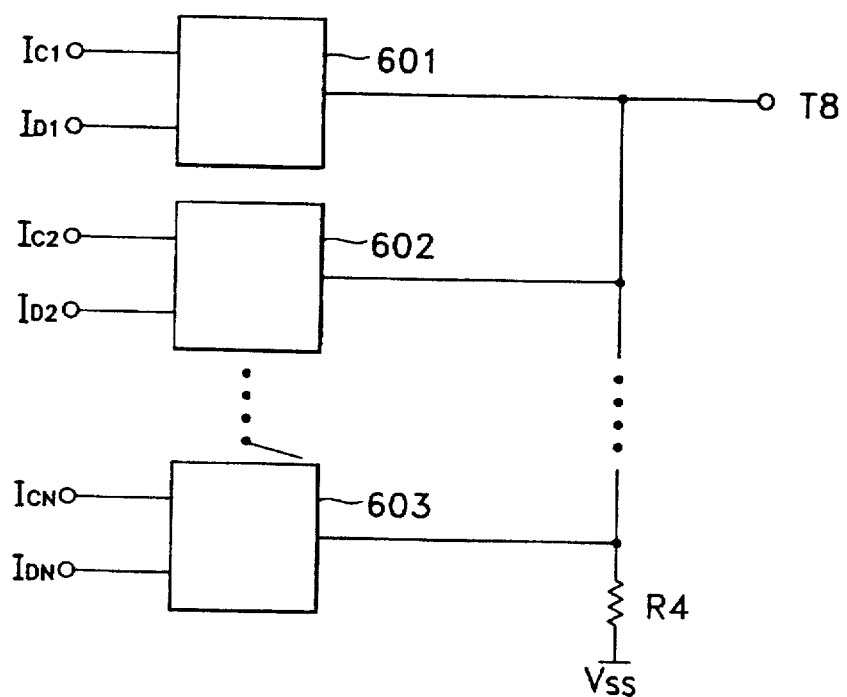
FIG. 8 is a block diagram illustrating the second embodiment of the logic circuit according to the present invention.

FIG. 8 is a block diagram illustrating a second embodiment of the logic circuit according to the present invention, which includes a reference potential source Vss typically corresponding to ground, and output node T8, a conductive load R4 coupled between the reference potential source $V_{ss}$ and output node T8, and a plurality of two-input rectifying transfer gate circuits 601, 602 and 603.

Referring to FIG. 8, the two-input rectifying transfer gate circuits 601, 602 and 603 each correspond to either the rectifying transfer gate circuit depicted in FIG. 4 or that depicted in FIG. 5.

Here, if the circuits 601, 602 and 603 correspond to FIG. 4, the output T8 is: (1) with any one pair of inputs of the two-input rectifying transfer gate circuits being different from each other. In other words, if one bit is "high" and the other bit is "low," then, the output node is a logic "high," and otherwise (2), the output node is a logic "low."

Meanwhile, if the circuits 601, 602 and 603 correspond to FIG. 5, the output T8 is: (1) with any one pair of inputs of the two-input rectifying transfer gate circuits being both logic "high," then, the output node is a logic "high," and otherwise (2), the output node is a logic "low."

Figure 9:
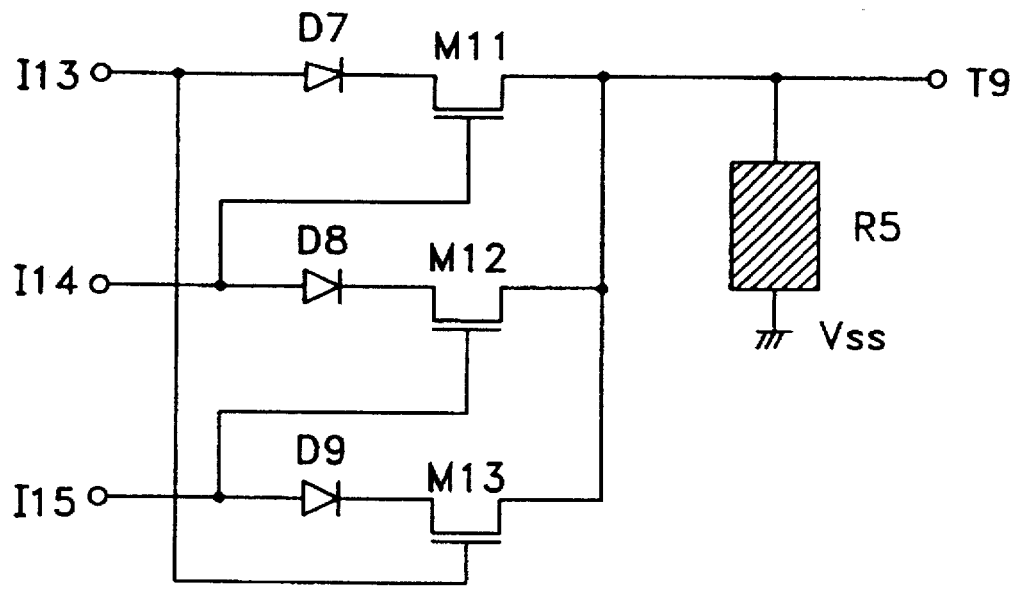
FIG. 9 is a circuit diagram illustrating a first embodiment of the carry logic circuit according to the present invention.

FIG. 9 is a circuit diagram illustrating a first embodiment of the carry logic circuit according to the present invention, wherein the carry logic circuit includes three input nodes I13, I14 and I15, an output node T9, a conductive load R5, three diodes D7, D8 and D9, three NMOS transistors M11, M12 and M13, and a reference potential source $V_{ss}$ corresponding to ground.

The anodes of diodes D7, D8 and D9 are coupled to input nodes I13, I14 and I15, respectively, and the sources of NMOS transistors M11, M12 and M13 are coupled to the cathodes of diodes D7, D8 and D9, respectively. The gates of NMOS transistors M11, M12 and M13 are coupled to input nodes I14, I15 and I13, respectively, and the drains are commonly coupled to output node T9. The conductive load R5 is coupled between output node T9 and the reference potential source $V_{ss}$, so as to increase the speed of the response.

In this carry logic circuit, two of the input nodes each receive an input signal which are summed together, while the other input node receives a carry input signal. Given that the two input signals are denoted as SA and SB, the output node T9 produces a logic result value of (SA*SB)+(SB*SC)+(SC*SA). Here, "+" represents the logical OR function and "*" represents the logical AND function.

Figure 10:
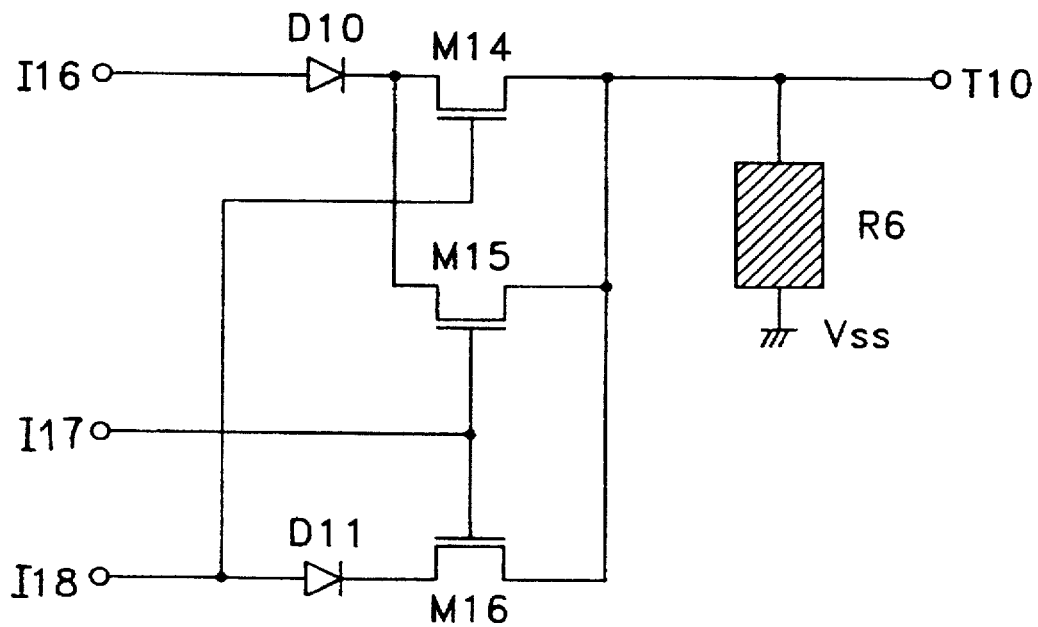
FIG. 10 is a circuit diagram illustrating a second embodiment of the carry logic circuit according to the present invention.

FIG. 10 is a circuit diagram illustrating a second embodiment of the carry logic circuit according to the present invention, which includes three input nodes I16, I17 and I18, an output node T10, a reference potential source $V_{ss}$, two diodes D10 and D11, three PMOS transistors M14, M15 and M16, and a conductive load R6.

Referring to FIG. 10, the anode of diode D10 is coupled to input node I16 and the anode of diode D11 is coupled to input node I18. For PMOS transistor M14, the source is coupled to the cathode of diode D10, the gate is coupled to input node I18, and the drain is coupled to output node T10. The source of PMOS transistor M15 is coupled to the cathode of diode D10, the gate is coupled to input node I17, and the drain is coupled to output node T10. For PMOS transistor M16, the source is coupled to the cathode of diode D11, the gate is coupled to input node I17, and the drain is coupled to output node T10. The conductive load R6 is coupled between output node T10 and the reference potential source which corresponds to the logic "low" level.

In this carry logic circuit, as in the carry logic circuit illustrated in FIG. 9, two of the input nodes each receive an input signal which are summed together, while the other input node receives a carry input signal. Here, the output node T10 produces a logic result value of (SA*SB)+(SB*SC)+(SC*SA).

Figure 11:
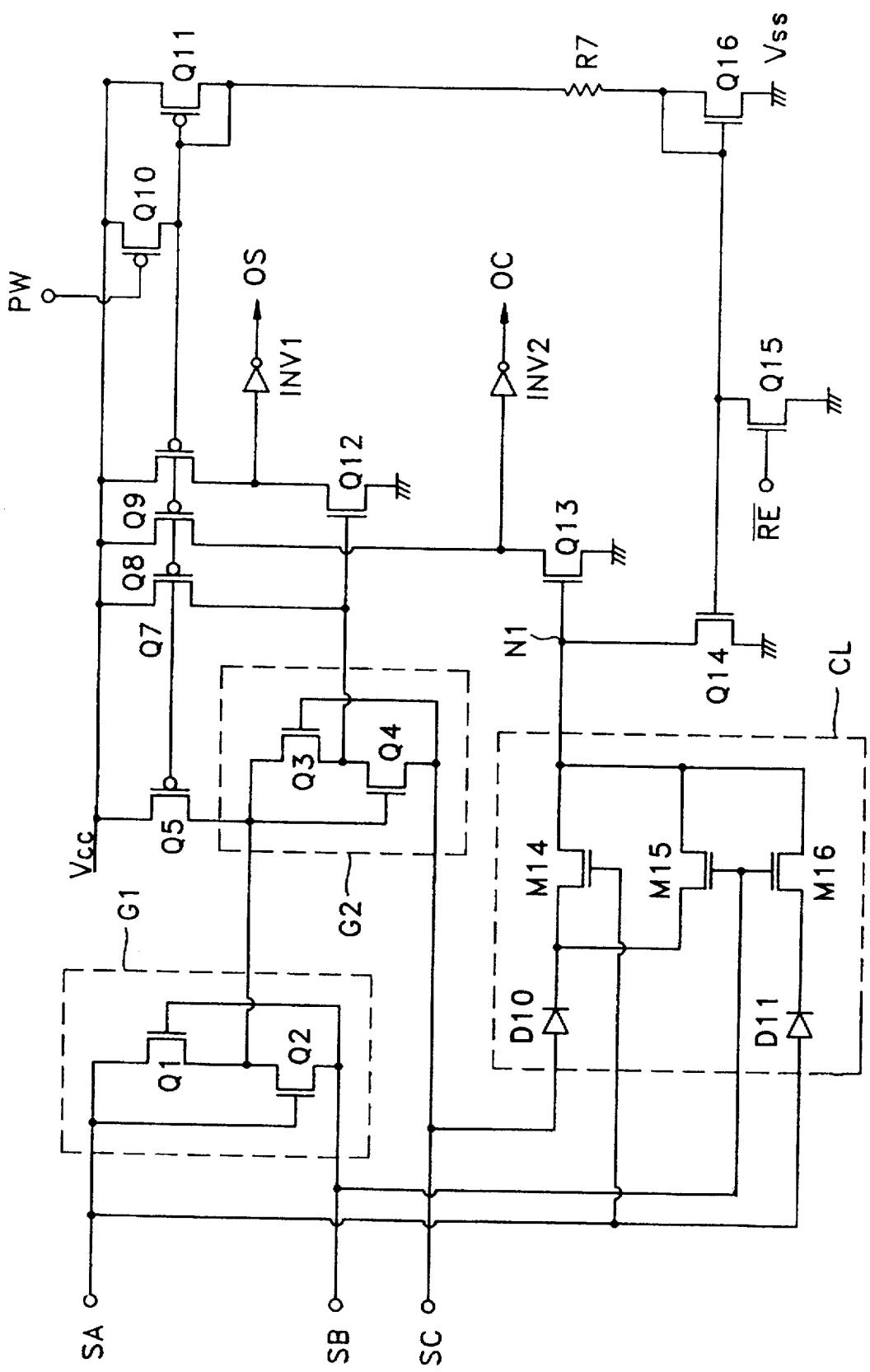
FIG. 11 through FIG. 13 are circuit diagrams illustrating adders according to the present invention.
Figure 12:
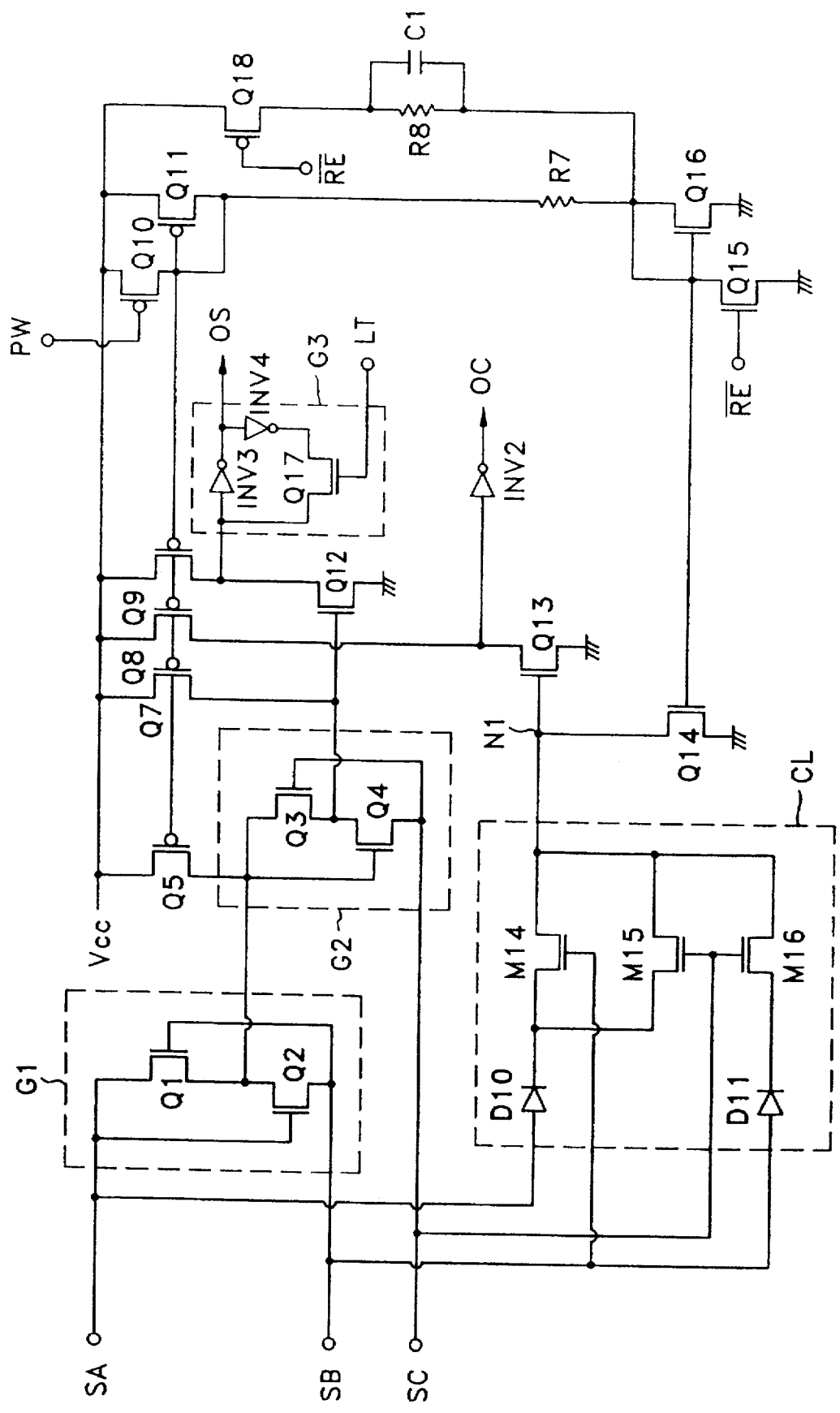
Figure 13:
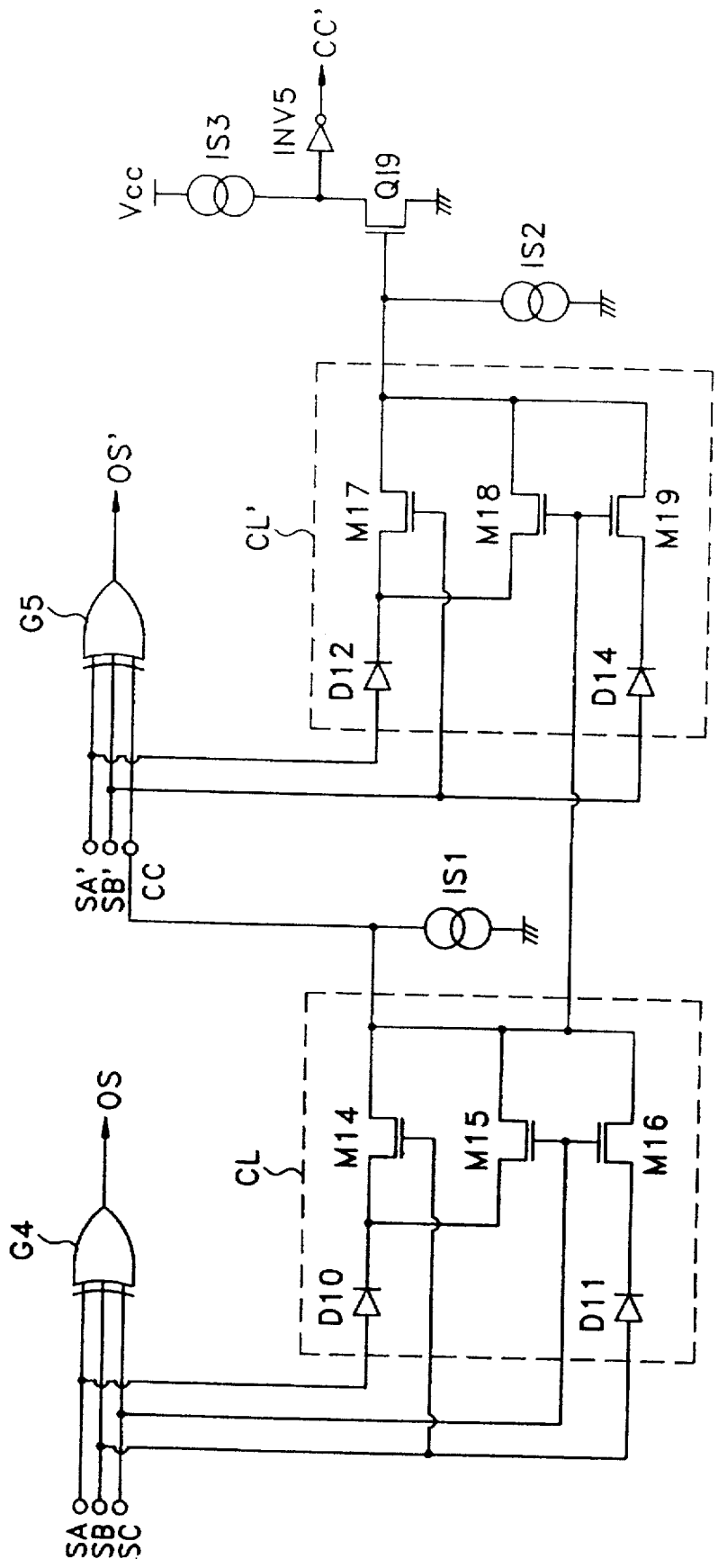

FIG. 11 through FIG. 13 are circuit diagrams illustrating adders according to the present invention, wherein each adder adopts the carry logic circuit shown in FIG. 10.

Referring to FIG. 11, input nodes SA and SB receive two input signals to be summed and carry input node SC receives a carry input signal. NMOS transistors Q1 and Q2 constitute an exclusive OR gate G1 and NMOS transistors Q3 and Q4 constitute an exclusive OR gate G2. Here, the exclusive OR gate G1 produces a logic result of SA⊕SB and the exclusive OR gate G2 produces a logic result of SA⊕SB⊕SC, or the sum signal, wherein "⊕" represents the logical exclusive-OR function. PMOS transistor Q8, NMOS transistor Q13 and inverting amplifier INV2 constitute an output buffer for the carry output signal, and PMOS transistor Q9, NMOS transistor Q12 and inverting amplifier INV1 constitute an output buffer for the sum signal. Here, PMOS transistor Q8 and NMOS transistor Q13 constitute an inverter, so the output of inverting amplifier INV2 is equivalent to the amplified carry output signal. Correspondingly, PMOS transistor Q9 and NMOS transistor Q12 also constitute an inverter, so the output of inverting amplifier INV1 is equivalent to the amplified sum signal. The gate of NMOS transistor Q15 receives the carry reset signal RE which is an active low signal. Accordingly, if the carry reset signal RE is "low," NMOS transistor Q15 turns off so that the gate of NMOS transistor Q14 is at a logic "high" state, which turns Q14 on. Therefore, the node N1 is reset to the logic "low" state. This reset operation is performed just before the adding operation, for the high speed transferring of the input signals and the carry input signal during the adding operation.

The gate of PMOS transistor Q10 is applied with a power supply control signal PW. If the power supply control signal PW is high PMOS (e.g. Vcc), transistor Q10 turns off, so the gates of PMOS transistors Q15, Q7, Q8, Q9 and Q11 are all supplied with a logic "high" signal, which thereby turns these transistors on so that power from the reference potential source $V_{cc}$ is supplied to the circuit. Meanwhile, if the power supply control signal PW is low (e.g. Vss), PMOS transistor Q10 turns on so as to cut off the power supply.

PMOS transistor Q11, resistor R7 and NMOS transistor Q16 (being diode-connected) serve as a constant current circuit, wherein the current is supplied through PMOS transistor Q11 and resistor R7 to NMOS transistor Q15, thereby stably performing the carry reset operation.

The adder shown in FIG. 12, as compared with that shown in FIG. 11, includes a latch gate G3 substituting for the inverting amplifier INV1 and further comprises PMOS transistor Q18, resistor R8 and capacitor C1 as the constant current circuit for carry reset operation.

In FIG. 12, latch gate G3 includes: an inverting amplifier INV3 having an input coupled to the drain of NMOS transistor Q12; an inverting amplifier INV4 having an input coupled to the output of inverting amplifier INV3; and an NMOS transistor Q17 having a source and drain coupled to the input of inverting amplifier INV3 and the output of inverting amplifier INV4, respectively, and a gate receiving a latch control signal LT. This latch gate G3 latches the sum signal when the latch control signal LT is "high," resulting in reducing the time required for supplying power to the adder.

The gate of PMOS transistor Q18 is applied with the carry reset signal RE. Accordingly, if the carry reset signal is "low," PMOS transistor Q18 turns on. Here, capacitor C1 serves as a speed-up capacitor, which rapidly increases the voltage of the drain of NMOS transistor Q15 during the reset operation, so as to greatly decrease the discharging time of the node N1.

FIG. 13 illustrates yet another embodiment of the adding circuit according to the present invention, and particularly illustrates two adding circuits which are connected in a two-stage cascade configuration.

In FIG. 13, exclusive OR gate G4 produces a first sum signal with regard to input signals SA and SB and a carry input signal SC, and exclusive OR gate G5 produces a second sum signal with regard to input signals SA' and SB' and a first carry output signal CC. Carry logic circuit CL produces the first carry output signal with regard to input signals SA and SB. Carry logic circuit CL' produces a second carry output signal CC' with regard to input signals SA' and SB' and the first carry output signal CC. Constant current sources IS1 and IS2 stabilize the carry outputs of the corresponding adder. Constant current source IS3, an inverting amplifier INV5 and NMOS transistor Q19 serve as buffer for the carry output signal, or interstage amplifier. Here, the carry logic circuit for the present invention causes one voltage drop (corresponding to the transistor threshold voltage) per stage, so one interstage amplifier can be implemented for several stages, instead of being implemented at every stage.

The rectifying transfer gate circuit as described above, can be simply implemented by forming a field effect transistor and a diode in separate regions and connecting one with the other via a conductive line. However, this structure has a problem in that, as the size of the diode is increased, the required area is increased together with an increase in stray capacitance, so as to reduce operation speed.

Figure 14:
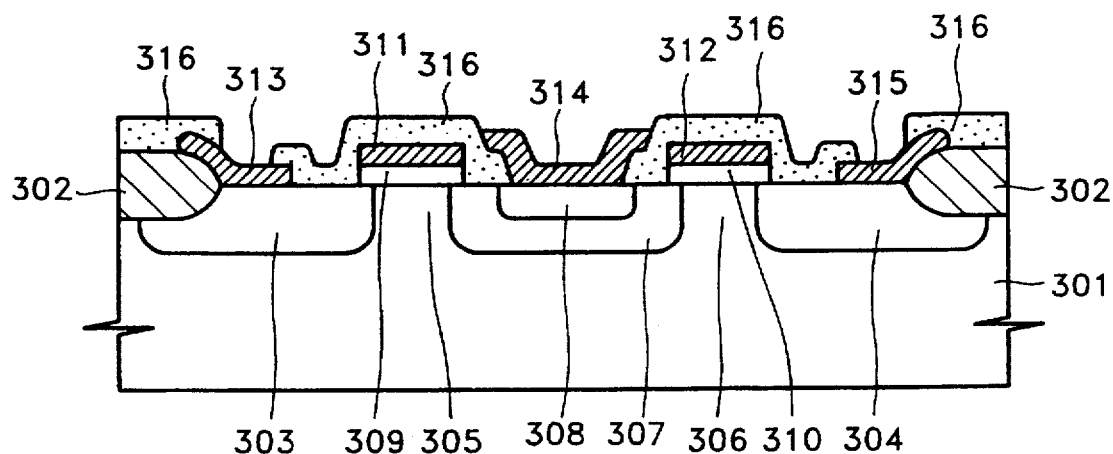
FIG. 14 is a cross-sectional view illustrating a first embodiment of the semiconductor structure according to the present invention.
Figure 15:
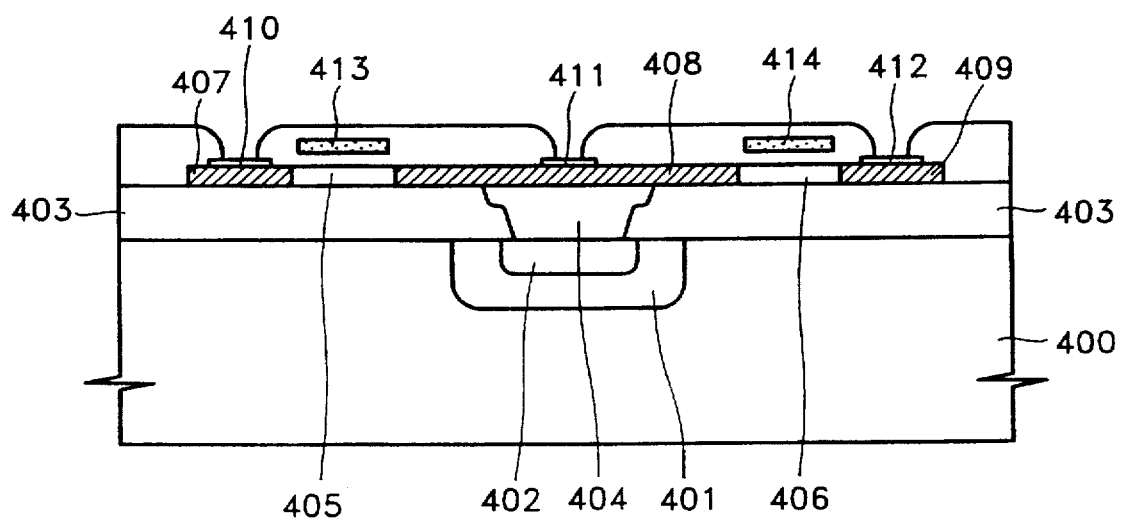
FIG. 15 is a cross-sectional view illustrating a second embodiment of the semiconductor structure according to the present invention.

Therefore, to increase the integration density and simultaneously reduce the stray capacitance, it is desirable to implement a semiconductor device such as that shown in FIG. 14 or FIG. 15.

FIG. 14 is a cross-sectional view illustrating a first embodiment of a semiconductor structure according to the present invention.

In FIG. 14, to define an active region and an isolating region, a field insulating layer 302 is selectively formed on a semiconductor substrate 301. Doping regions 303, 304 and 307 are formed in the active region and apart from one another. Here, doping regions 303, 304 and 307 all have the same conductivity, a transistor channel 305 is formed between doping regions 303 and 307, and a transistor channel 306 is formed between doping regions 307 and 304. In doping region 307, a doping region 308 having the opposite conductivity to that of doping region 307 is formed. A gate electrode 311 is formed over the transistor channel 305, with a gate insulating film 309 disposed therebetween, and a gate electrode 312 is formed over the transistor channel 306, with a gate insulating film 310 disposed therebetween. An electrode layer 313 is formed on the surface of doping region 303, and an electrode layer 315 is formed on the surface of doping region 304. Over gate electrodes 311 and 312, an insulating layer 316 having openings for exposing electrode layers 313 and 315 and doping region 308 is formed. An electrode layer 314 is formed on doping region 308, where electrode layer 314 is electrically isolated from gate electrodes 311 and 312 by insulating layer 316.

In this structure, one transistor included in the rectifying transfer gate circuit shown in FIG. 3 and FIG. 4 is constituted by doping region 303, transistor channel 305, doping region 307, gate insulating film 309 and gate electrode 311. The other transistor is constitute by doping region 304, transistor channel 306, doping region 307, gate insulating film 310 and gate electrode 312. Here, doping region 307 serves as the common drain of two MOS transistors. In addition, doping regions 307 and 308 constitute the diode. The output node of the rectifying transfer gate circuit shown in both FIG. 3 and FIG. 4 is constituted by electrode layer 314, and two input nodes are constituted by electrode layers 313 and 315, respectively.

As shown in the drawings, the diode included in the rectifying transfer gate circuit is constituted by the doping region adjacent thereto, so as not to require additional area for forming the diode.

FIG. 15 is a cross-sectional view illustrating a second embodiment of a semiconductor structure according to the present invention.

Referring to FIG. 15, a doping region 401 is formed on a semiconductor substrate 400 and a doping region 402 having the opposite conductivity to that of doping region 401 is formed in the doping region 401. An interlayer insulating layer 403 having an opening for exposing the surface of doping region 402 is formed on the surfaces of doping regions 401 and 402 and semiconductor substrate 400. A semiconductor layer is formed on a conductive material layer 404, for forming circuit elements.

In the semiconductor layer, doping region 407, transistor channel 405, doping region 408, transistor channel 406 and doping region 409 are sequentially and laterally arranged, whereby the doping region 408 is disposed on conductive material layer 404.

Gate electrode 413 is formed over transistor channel 405 with a gate insulating film disposed therebetween and gate electrode 414 is formed over transistor channel 406 with a gate insulating film disposed therebetween. In addition, electrode layers 410, 411 and 412 are formed on doping regions 407, 408 and 409, respectively.

In this structure, doping regions 401 and 402 constitute a diode, doping region 408 constitutes the common drain of two MOS transistors, and doping regions 407 and 409 respectively constitute the sources of two MOS transistors. Conductive material layer 404 serves as the conductive line for connecting the common drain of MOS transistors with the diode, and electrode layers 410, 411 and 412 constitute the two input nodes and first output node, respectively. Also, doping region 401 may be used as the second output node.

The gate electrode in the semiconductor device shown in FIG. 14 and FIG. 15, can be implemented by a silicide layer. Here, a silicide layer made from a metal such a Ti, Mo or W can be utilized for the NMOS transistor, while a silicide layer made from a metal such a Zr can be utilized for the PMOS transistor.

As described above, the rectifying transfer gate circuit according to the present invention can be implemented for a small number of circuit elements and an undesired circulating current in its application circuit can be prevented. Therefore, the signal delay is decreased and the manufacturing cost is reduced. Moreover, in the application circuit of the rectifying transfer gate circuit, malfunctions due to the undesired circulating current is prevented.

While the invention has been described in conjunction with a few specific embodiments, it is evident to those skilled in the art that many alternatives, modifications and variation will be apparent in light of the foregoing description. Moreover, the source and the drain of the MOS transistors can be exchanged resulting in an equivalent circuit.

Accordingly, the present invention is intended to embrace all such alternative modifications and variations as fall within the spirit and scope of the appended claims. Also, the drain and the source in the appended claims can be interpreted interchangeably.

What is claimed is:

1. A rectifying transfer gate circuit comprising:
    first and second input nodes for receiving first and second logic input signals, respectively:
        an output node for providing an output signal;
        a field effect transistor having a source coupled to said first input node, and a gate coupled to said second input node; and
        a diode having a first end coupled to a drain of said field effect transistor and having a second end coupled to said output node.

2. A rectifying transfer gate circuit according to claim 1, wherein:
    said field effect transistor is an NMOS transistor;
    said first end of said diode is a cathode of said diode; and
    said second end of said diode is an anode of said diode.

3. A rectifying transfer gate circuit according to claim 1, wherein:
    said field effect transistor is a PMOS transistor;
    said first end of said diode is an anode of said diode; and
    said second end of said diode is a cathode of said diode.

* * * * *

UNITED STATES PATENT AND TRADEMARK OFFICE
CERTIFICATE OF CORRECTION

PATENT NO. : 5,604,429
DATED : February 18, 1997
INVENTOR(S) : NAKASHIMA, Takashi It is certified that error appears in the above-identified patent and that said Letters Patent is hereby corrected as shown below:

Column 10, line 25, cancel beginning with "1. A rectifying transfer gate" to and including "the output node." in column 10, line 34, and insert the following claim:

1. A rectifying transfer gate circuit, comprising:
    input means receiving binary logic input signals;
    output node means for providing an output signal;
    bias means connected between said output node means and a reference potential;
    field effect transistor means for gating said binary logic input signals to be output via said output node means; and
    wherein said bias means comprises a diode having a first end coupled to said field effect transistor means and having a second end coupled to said output node means; and
    wherein said field effect transistor means and said diode are connected in series between said input node means and said output node means.

Column 10, line 37, after "field effect transistor", insert --means--.

Column 10, line 42, after "field effect transistor", insert --means--.

Signed and Sealed this

Seventeenth Day of February, 1998

*Attest:*

*Attesting Officer*

BRUCE LEHMAN

*Commissioner of Patents and Trademarks*